United States Patent [19]
Jin et al.

[11] Patent Number: 6,059,553
[45] Date of Patent: May 9, 2000

[54] INTEGRATED CIRCUIT DIELECTRICS

[75] Inventors: Changming Jin; Stacey Yamanaka; R. Scott List, all of Dallas, Tex.

[73] Assignee: Texas Instruments Incorporated, Dallas, Tex.

[21] Appl. No.: 08/992,362

[22] Filed: Dec. 17, 1997

Related U.S. Application Data

[60] Provisional application No. 60/034,423, Dec. 17, 1996.

[51] Int. Cl.⁷ ........................................ B05D 3/02
[52] U.S. Cl. .................. 421/387; 428/446; 428/447; 428/620; 257/914; 252/63.2 R; 252/62.3 Q; 252/62.3 BT
[58] Field of Search ................. 252/62.3 R, 62.3 Q, 252/62.3 BT; 257/914; 427/387; 428/447, 446, 620

[56] References Cited

U.S. PATENT DOCUMENTS 4,349,606  9/1982  Kishimoto et al. ................. 252/62.3 Q
4,652,894  3/1987  Potember et al. ................. 252/62.3 Q

*Primary Examiner*—Melvyn I. Marquis
*Attorney, Agent, or Firm*—Carlton H. Hoel; Richard L. Donaldson

[57] ABSTRACT

An integrated circuit with an intermetal level dielectric (IMD) including an organic-silica hybrid (110) and located between metal lines (104).

6 Claims, 3 Drawing Sheets

INTEGRATED CIRCUIT DIELECTRICS

This application claims priority under 35 USC § 119(e)(1) of provisional application No. 60/034,423 filed Dec. 17, 1996.

BACKGROUND OF THE INVENTION

The invention relates to electronic devices, and, more particularly, to integrated circuit insulation materials and fabrication methods.

The performance of high density integrated circuits is dominated by metal interconnect level RC delays due to the resistivity of the metal lines and the capacitive coupling between adjacent lines. The capacitive coupling can be reduced by decreasing the relative permittivity (dielectric constant) of the dielectric (insulator) between adjacent lines.

Various dielectric materials have been suggested for use in silicon integrated circuits; namely, silicon dioxide (currently the dominant dielectric material with a relative permittivity about 4.0), inorganic materials such as flourinated silicon dioxide (relative permittivities about 3.0–4.0), organic materials such as polyimide, parylene, amorphous teflon (relative permittivities about 1.9–3.9), and porous dielectrics such as silicon dioxide xerogels (relative permittivity depending upon pore size and density, typically 1.3–3.0). Indeed, the pore sizes in silica xerogels are usually much smaller than the integrated circuit feature size; see Smith et al., Preparation of Low-Density Xerogel at Ambient Pressure for Low k Dielectrics, 381 Mat. Res. Soc. Symp. Proc. 261 (1995). The porosity can be up to 99%.

Thin film silica xerogels for integrated circuit dielectrics can be fabricated by the generic steps of (1) precursor preparation, (2) spin coating, (3) aging, (4) solvent exchange, and (5) drying. The acid-base sol-gel reactions could be as follows:

Hydrolyze an alkoxide in a solvent:

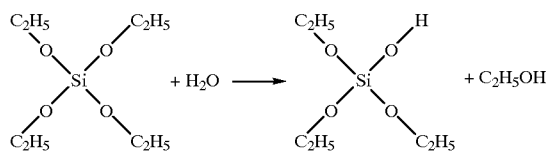

the solvent conveniently could be ethanol.

Then condensation:

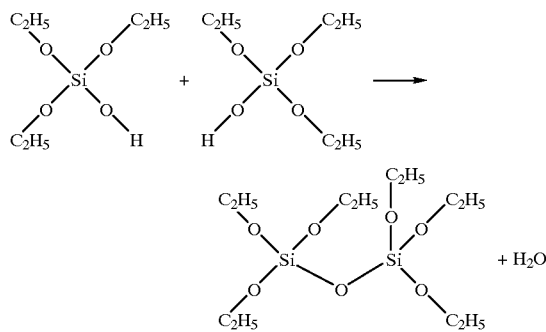

The condensation would be controlled so that spin coating occurs after partial condensation to an appropriate viscosity.

The solvent exchange step replaces the original solvent residing within the pores of the condensed network by low-surface-tension solvent to reduce the capillary pressure during drying and minimize the collapse of pores. U.S. Pat. No. 5,561,318 discloses variations of the process.

However, porous silica has not yet become manufacturable.

Shea et al., Arylsilsesquioxane Gels are related Materials, New Hybrids of Organic and Inorganic Networks, 114 J. Am. Chem. Soc. 6700 (1992), describe gels made from hydrolysis and condensation of monomers such as benzene with two ethoxysilyl groups; the gels were dried and the macroporous polymer network collapsed yielding a microporous polysilsesquioxane xerogel.

SUMMARY OF THE INVENTION

The present invention provides porous hybrid organic-silica integrated circuit dielectrics. It has been discovered that porous silica has problems including brittleness and cracking; and this can limit available processing steps. Further, carbon—carbon, carbon-hydrogen, and carbon-flourine bonds typically are less polarizable than the silicon-oxygen bonds of silica, so porous hybrid dielectrics have a lower permittivity than comparably porous silica.

The porous hybrid-organic-silica has advantages over porous silica including lower permittivity for a given xerogel density and increased material flexibility to limit brittleness problems during integrated circuit fabrication.

BRIEF DESCRIPTION OF THE DRAWINGS

The drawings are schematic for clarity.

DESCRIPTION OF THE PREFERRED EMBODIMENTS

Overview

Porous hybrid organic-silica dielectrics derive from monomers of the general formula $(RO)_3Si—A—Si(OR)_3$ where R is any convenient alkyl group and A represents an organic bridging group; this contrasts with the prior art monomer $Si(OR)_4$. For example, A could be methylene, phenylene, biphenylene, xylylene, and so forth as illustrated in the preferred embodiments. Hydrolysis and condensation of the monomers provide gels analogous to the prior art:

$(RO)_3Si—A—Si(OR)_3+H_2O \rightarrow (RO)_3Si—A—Si(OR)_2—O—Si(OR)_2—A—Si(OR)_3+ROH$ A lack of polarizable bonds in A helps lower the permittivity, and fluoro substitutions provide further preferred embodiments with the additional advantage of higher temperature tolerance due to the stability of carbon-fluorine bonds.

Figure 1:
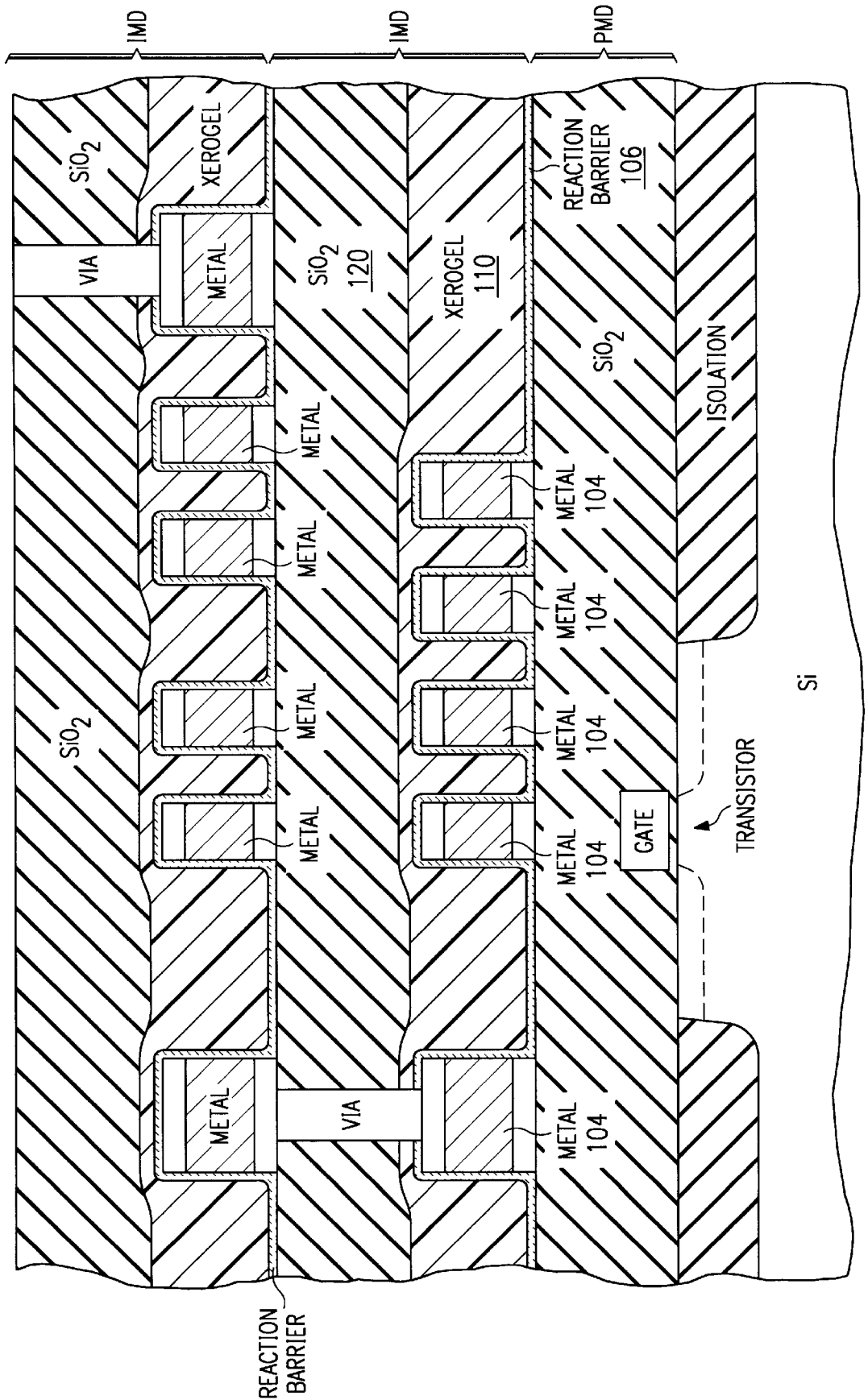
FIG. 1 shows in cross sectional elevation view a first preferred embodiment intermetal level dielectric.

FIG. 1 shows in cross sectional view preferred embodiment intermetal level dielectrics (IMDs) of xerogel 110 plus silicon dioxide 120 and a reaction barrier (passivation layer) 106. Metal lines 104 have widths of about 0.25–0.5 $\mu$m, a height of about 0.7 $\mu$m, and minimal spacing also of about 0.25 $\mu$m. Premetal level dielectric (PMD) covers the transistor.

Aryl Bridging Group Hybrid Xerogel Dielectrics

The first preferred embodiment dielectric has monomer 1,4-bis(triethoxysilyl)benzene which hydrolyzes in a solution of ethylene glycol, ethanol, water, and 1M $HNO_3$ by refluxing for 1–2 hours at 70 C. (molar ratios of 1:3:1.5:1.5:0.042 of monomer, ethylene glycol, ethanol, water, and nitric acid) by reactions such as:

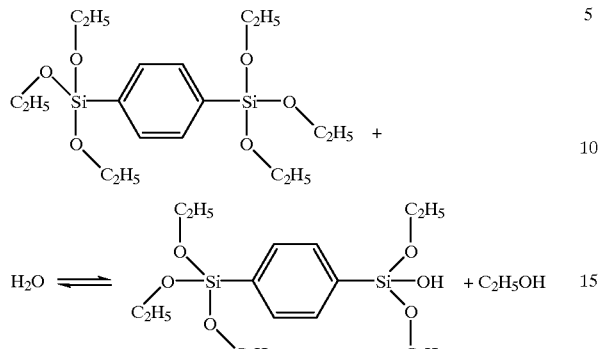

The mild acidic conditions catalyze the hydrolysis, and higher temperatures (e.g., 70° C.) increase the reaction rate, but ethanol boils at about 78° C. Replacements of two or more ethoxy groups per monomer may occur; however, the competing condensation of the hydroxyl groups to form Si—O—Si bonded dimers, trimers, . . . eliminates hydroxyls by reactions such as:

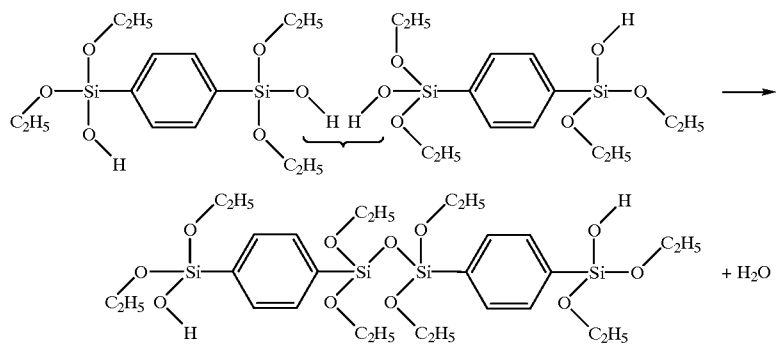

The hydrolysis plus condensation reactions slowly convert the monomers to oligomers of varying sizes, and the viscosity of the solution increases. Upon reaching a suitable degree of polymerization, the solution is cooled down to room temperature and diluted with ethanol (up to 300%) which yields a shelf life of several months or longer. Typically, the average oligomer will be made of 3–10 monomers and have most of its ethoxy groups replaced by hydroxyl groups or siloxane bonds. The oligomers may crosslink during condensation due to the large number of hydroxyl sites on each oligomer.

A base such as ammonium hydroxide ($NH_4OH$) catalyzes the further condensation of the oligomers; 0.25M $NH_4OH$ (10% by volume) can be added to the oligomer solution just prior to spin coating. Alternatively, the oligomer solution can be used without the base addition. An 8 inch diameter wafer requires about 3 ml of solution to provide a coating of about 1 $\mu$m average thickness. A spin speed of 1000–5000 rpm for about 10–15 seconds typically suffices. Various spin speeds can be programmed in the spin coating process to control film streaks, and backside rinse and edge bead removal also can be incorporated to remove edge and backside deposits. Spray or dip coating may also be used. The condensation reaction further polymerizes the oligomers and thereby forms a solvent-saturated thin film gel with a silsesquioxane polymer network roughly like:

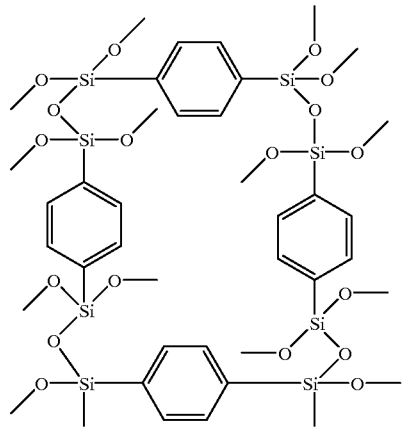

After coating, age the thin film gel to continue condensation and network formation. Maintain the solvent in the gel by a saturated atmosphere of ethylene glycol over the wafer. An aging temperature of 120° C. for 2–4 minutes completes the condensation; a base catalyst may be introduced into the atmosphere. A lower temperature aging would demand a greater aging time.

Solvent evaporation during aging can cause premature drying and substantial shrinkage of the gel, which increases the film density and permittivity and induces film cracking. Thus, limit solvent evaporation by controlling the atmosphere over the wafer or by the use of less volatile solvents such as glycerol in place of ethanol.

The overall hydrolysis/condensation converts roughly 70% of the original ethoxysilicon R—O—Si bonds into siloxane Si—O—Si bonds and the remaining ethoxysilicon bonds into mostly silanol Si—O—H bonds. The surface Si—O—H groups are active and hydrophilic, but are isolated on the network and do not further condense.

The network has micropores with diameters less than 10 nm. Note the 250 nm minimal spacings between adjacent metal lines in FIG. 1 greatly exceeds pore size and the metal line geometry has little impact on gel formation.

After aging, rinse the wafer with ethanol on a spinner to replace the high-surface-tension solvent ethylene glycol in the pores to reduce the capillary pressure during subsequent drying. Due to the small pore size (small radius of curvature), high capillary pressure exists during solvent evaporation (i.e., when a pore surface is partially wetted so the liquid surface tension is asymmetrical) and can cause the polymer network to collapse, producing a denser film.

Further, the pore surface Si—O—H groups present a hydrophilic surface which can adsorb moisture; this will increase the film permittivity and corrode adjacent metal surfaces. Also, possible further condensation reactions of the SiOH groups during drying can cause permanent shrinkage of the network. Therefore, rinse the wafer with hexamethyldisilazane (HMDS) $(CH_3)_3Si—NH—Si(CH_3)_3$ to modify the pore surfaces by replacing the Si—O—H groups with Si—O—Si$(CH_3)_3$ groups which are hydrophobic and also cannot further condense.

Next, rinse the wafer with heptane or hexane to further lower capillary pressure during gel drying. Lastly, dry the gel by placing the wafer on a hot plate at 300–350° C. for about 60 seconds. This leaves a xerogel (the polymer network) with air filled pores.

The HMDS or other surface modification could also be performed after drying if the polymer network is strong enough to withstand the capillary pressure during drying.

The following section describes use of the foregoing xerogel method in fabrication of one of the IMD layers of FIG. 1.

IMD Fabrication

Figure 2A:
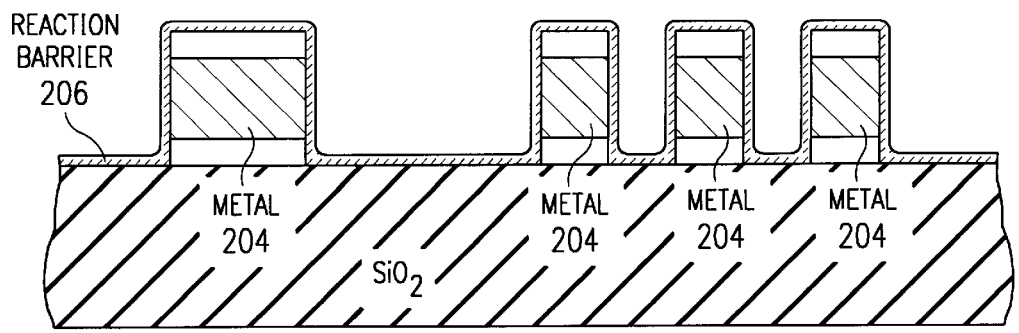
FIGS. 2a–c illustrate in cross sectional elevation views a preferred embodiment method of fabrication.
Figure 2B:
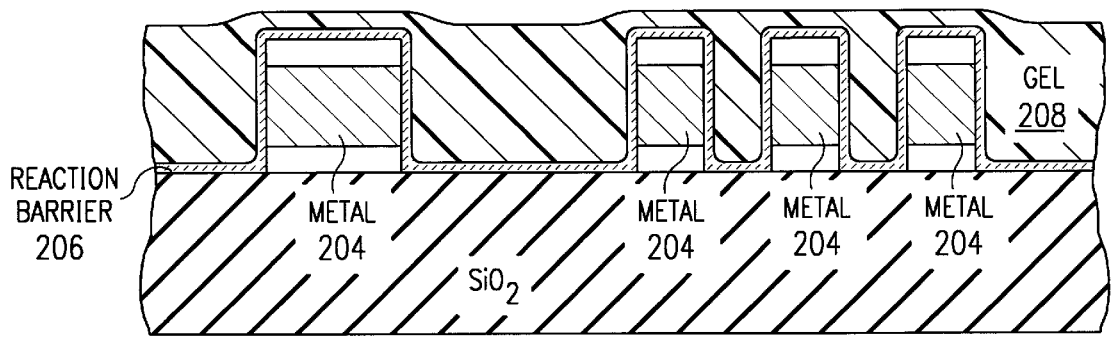
Figure 2C:
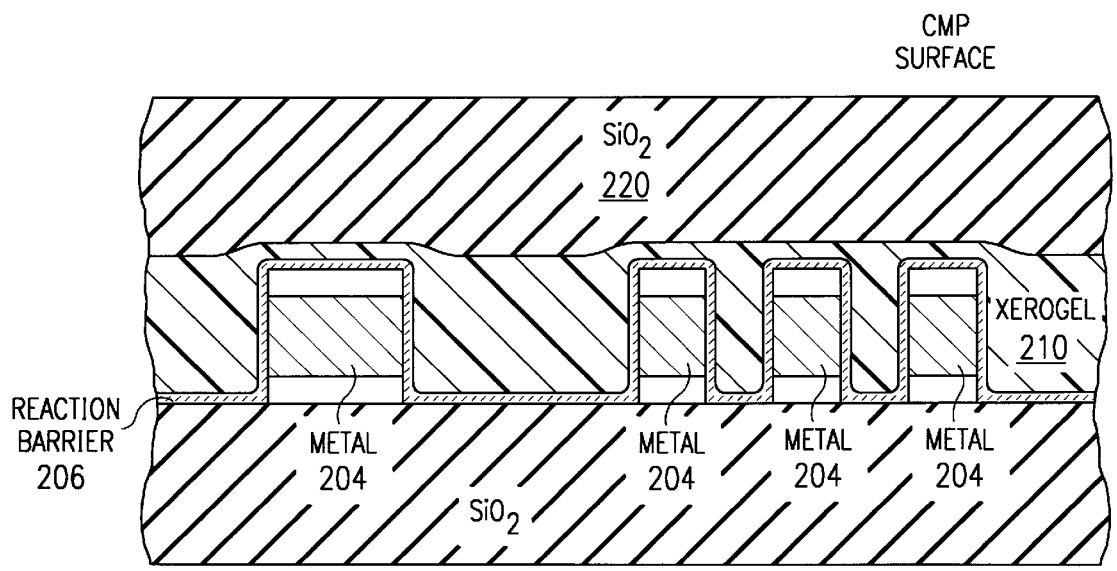

FIGS. 2a–c illustrate fabrication steps for a preferred embodiment xerogel IMD structure which also contains a passivation (reaction barrier) layer for the xerogel. In particular, FIG. 2a shows clad aluminum lines 204 of widths 0.25–0.6 μm, heights 0.7 μm, and minimal spacings between lines 0.25 μm. Conformal passivation layer 206 on metal lines 204 and underlying dielectric provides a chemical reaction barrier for metal lines 204, protecting them from corrosion. Passivation layer 206 may be silicon dioxide, has a thickness of 10–50 nm, and may be deposited by (plasma enhanced) CVD.

FIG. 2b shows oligomer solution spun on to form thin film gel 208. This uses the previously described oligomer solution and spin on with condensation catalyst. An average film 208 thickness of 0.3–0.5 μm fills in the minimal spacings despite their depths of 0.7 μm; the film thickness over metal lines 204 is only about 0.1 μm.

Process the gel as previously described (age, replace solvent, modify pore surface, and dry) to form xerogel 210. Then deposit overlying silicon oxide 220 and planarize, such as by chemical mechanical polishing (CMP), to yield a planar surface as shown in FIG. 2c. Via formation and filling yields the lower IMD layer as in FIG. 1.

The spin on to form gel 208 provides a reasonably planar surface, so the CMP of the overlying silicon oxide may be omitted.

Monomer Preparation

The monomer for the first preferred embodiment can be prepared by first adding a small crystal of iodine to a mixture of 15 g of magnesium turnings and 450 ml of TEOS in 300 ml of tetrahydrofuran (THF) and refluxing the mixture under a nitrogen atmosphere. Next, add dropwise over 2 hours a solution of 48 g of 1,4-dibromobenzene in 100 ml of THF to the refluxing mixture. Within 30 minutes of initiating the addition the reaction becomes mildly exothermic. Keep the reaction mixture refluxing 1 hour after the completion of the addition of the dibromide. Cool the gray-green mixture to room temperature, and then remove the THF in vacuo. Add hexane to precipitate any remaining magnesium salts in solution and filter the mixture under nitrogen to yield a clear, light brown solution. Remove the hexane in vacuo, and distill off the remaining TEOS in vacuo to leave a brown oil. Distill the brown oil (130–135° C. at 200 mTorr) to give a clear colorless oil monomer.

Fluorinated Hybrid Xerogels

The second embodiment xerogel IMD is a fluorinated version of the first preferred embodiment. In particular, the xerogel has fluorine substituted for the hydrogen on the benzene ring bridging group. All four hydrogens, or only some, may be fluorine substituted; the greater the fluorine content, the better the temperature tolerance and the lower the permittivity when all other parameters remain fixed.

The fluorinated xerogel may be made from a fluorinated monomer with the same processing steps or may be fluorinated after xerogel fabrication by exposure to $F_2$ at low pressure. The fluorination after fabrication should swell the xerogel due to the larger size of a fluorine atom as compared to hydrogen, but the swelling should only decrease porosity. The fluorination also evolves HF which must be pumped away to avoid metal or oxide etching for the case of fluorination after anisotropic etching. Also, the surface modification with HMDS to replace silanol groups may be replaced with a fluorinated version $(CF_3)_3Si—NH—Si(CF_3)_3$.

Thermal Stability

Integrated circuit fabrication usually includes very high temperature initial processing steps, but after metal line formation, typically aluminum based, processing temperatures peak at about 450° C. (the sintering temperature for aluminum) due to the low melting point of aluminum. Consequently, IMD materials should be thermally stable up to roughly 500° C. in an inert atmosphere. The conjugated bond stability of the preceding bridging group examples provides such thermal stability for the xerogels; indeed, the use of pore surface modification with phenyl groups in place of methyl groups enhances thermal stability. That is, replace the pore surface groups —O—Si$(CH_3)_3$ with —O—Si$(C_6H_5)_3$ groups.

Similarly, (partial) fluorination typically increases thermal stability, so (partially) fluorinated version of the preceding such as $(RO)_3Si—C_6F_4—Si(OR)_3$ monomers or surface modifications groups such as —O—Si$(CF_3)_3$ or —O—Si$(C_6F_5)_3$ enhance thermal stability.

Alternative Bridging Groups

Further preferred embodiments are similar to the first preferred embodiment but use different bridging groups in the monomer and xerogel. In particular, the bridging groups may consist of alkanes, branched alkanes, alkenes, branched alkenes, alkynes, branched alkynes, cycloalkanes, and arenes as exemplified by the following monomers:

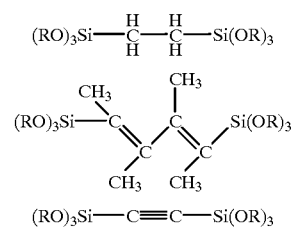

-continued

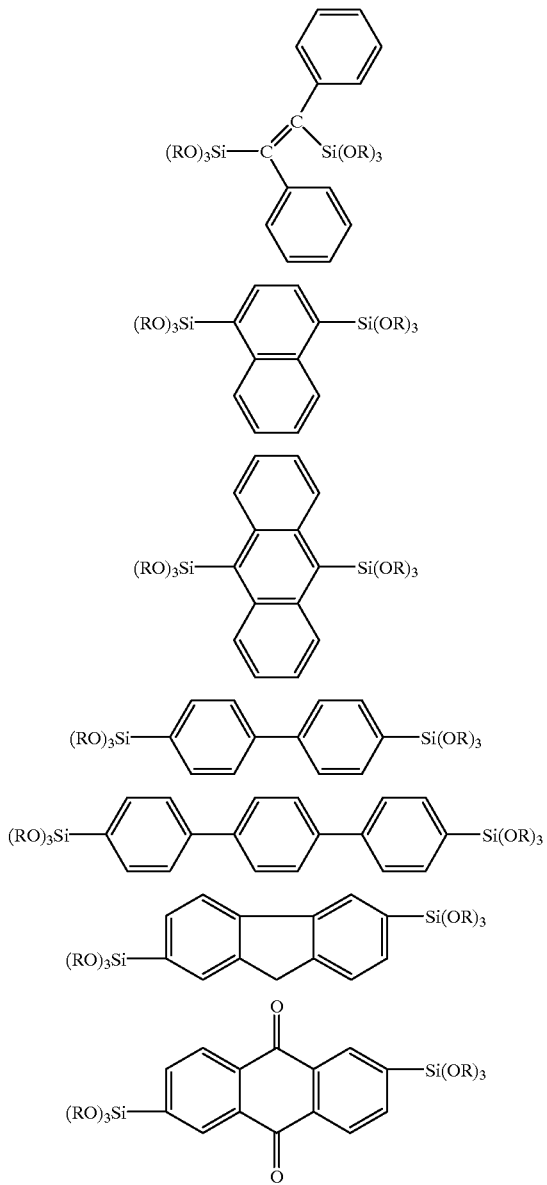

The alkane, alkene, and alkyne chains may have from 1 to 12 carbon atoms; with more than 12 carbon atoms the polymer network begins to resemble polyethylene. Similarly, alkene and alkyne chains of similar length provide somewhat similar xerogels. Cycloalkanes with 3 to 8 carbon rings may be used. Fused or linked benzene or other rings may be used provided the shortest path of carbon atoms between silicon atoms does not exceed 12.

The selection of bridging group depends upon the desired xerogel thermal stability and flexibility. In particular, thermal stability increases from alkane to comparable alkene to comparable alkyne to comparable cycloalkane to comparable arene. Conversely, flexibility increases in reverse order: arenes being the least flexible and the alkane being the most flexible.

With all of these bridging groups, fluorination increases thermal stability. A drawback of fluorination is possible metal corrosion from the fluorine.

Also, copolymers of two or more of the foregoing monomers could be used to have intermediate characteristics.

Alternative IMD Structures

Figure 3A:
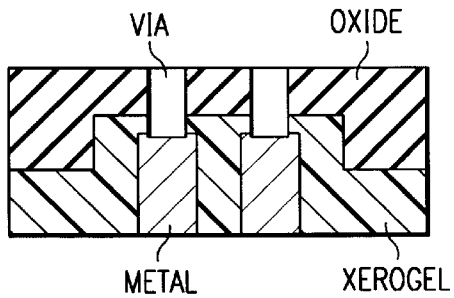
FIGS. 3a–f show alternative preferred embodiment dielectric structures.

The preferred embodiment xerogels may be used in alternative preferred embodiment IMD structures as heuristically illustrated in cross sectional views by FIGS. 3a–f. In particular, FIG. 3a shows xerogel with overlying oxide and vias over the metal lines; this is the same as FIG. 2c plus vias and with the passivation layer omitted.

Figure 3B:
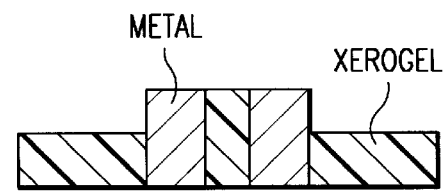

FIG. 3b shows xerogel in a minimal spacing between metal lines and on the open field away from the minimal spacing. This xerogel structure derives from an etchback down to the metal lines of the original spun on xerogel as illustrated in FIG. 2b. An overlying oxide would be deposited on the etched back xerogel to complete the IMD. The etched back xerogel has the advantage of preserving the xerogel in the minimal spacing but reducing the thickness in the open field and thus reducing the mechanical strength demands. It also prevents xerogel blowout during via etch. Indeed, the more conformal the original spun on xerogel, the thinner the etched back xerogel in the open field while maintaining the xerogel filled minimal spacing.

Figure 3C:
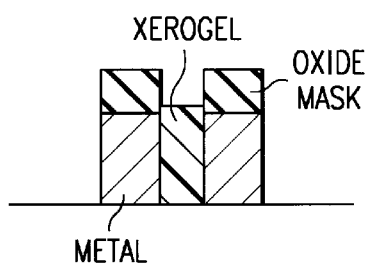

FIG. 3c shows oxide masks on the metal lines and xerogel only in the minimal spacing; subsequent deposition of oxide and planarization completes the IMD layer. The structure of FIG. 3c can conveniently be fabricated by first using the oxide masks for the metal etch to form the metal lines shown, next spin on xerogel which fills the minimal spacing plus the open field and covers the oxide masks, and then etch back to clear the open field but leaving the minimal spacing filled at least to the height of the metal lines. This differs from the etchback of FIG. 3b in that the oxide masks essentially extend the minimal spacing vertically so the etchback can remove the open field xerogel before removing xerogel between the metal lines. For example, if the metal lines are 0.7 µm high, the oxide mask 0.3 µm high, and xerogel thickness 0.5 µm over the open field and 0.2 µm over the oxide masks, then an etchback of 0.5 µm will just clear the open field but leave 0.7 µm in the minimal spacing. Of course, xerogel left on the exterior sidewall of the metal lines would not be detrimental; either isotropic or ansiotropic etchback works.

Figure 3D:
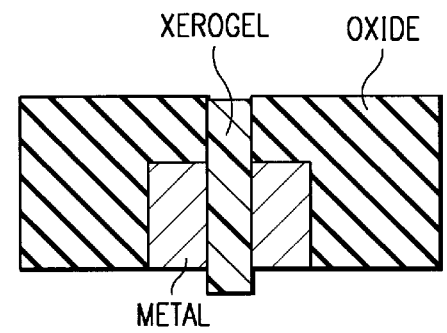

FIG. 3d has xerogel only in an etched slot between minimally-spaced metal lines, this allows the xerogel to extend above and below (by slot etching into underlying dielectric) the metal lines and thereby also presents low permittivity material to fringing electric fields. Fabrication of this IMD structure proceeds by the steps of depositing a metal followed by the deposition of an oxide, masking and etching the oxide and the metal depositing a passivation layer, spinning on and drying xerogel which will fill the minimal spacings plus cover the oxide, and lastly etching back to remove the xerogel from top of the oxide leaving it only in the slots.

Figure 3E:
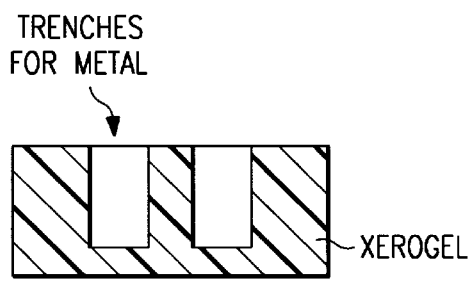

FIG. 3e shows a damascene structure using xerogel. In particular, first form the xerogel (prior to the metal lines), next anisotropically etch trenches (plus possible vias to underlying conductors) in the xerogel, then blanket deposit metal which fills the trenches and covers the xerogel, and lastly CMP to remove the metal on the upper xerogel surface but leave the metal in the trenches to form metal lines.

Figure 3F:
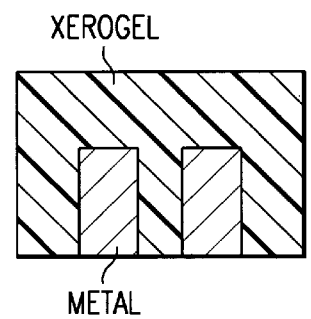

FIG. 3f shows a very thick xerogel which provides the entire IMD (except for possible passivation layers).

The structures of FIGS. 3a–b, e–f require mechanical strength from the xerogel, especially the structure of FIGS. 3e–f. In contrast, the structures of FIGS. 3c–d only use the xerogel in minimal spacings. The mechanical strength depends upon the xerogel density. The preferred embodiment hybrid xerogels have a lower permittivity than comparable density silica xerogels; thus for a required permittivity, the hybrid xerogels may be denser and thereby stronger than silica xerogels.

IMD Applications

The foregoing xerogels between metal (or other conductive) lines can be applied to various integrated circuit types. For example, memories (DRAMs, SRAMs, flash EPROMs, et cetera) have many sets of long parallel conductive lines such as bitlines, wordlines, straps, address and data busses, and so forth, and the xerogel filling minimal spacings in such steps of parallel lines decreases capacitive coupling and associated crosstalk.

Modifications

The preferred embodiments may be varied in many ways while retaining one or more of the features of organic bridging groups in silica xerogels used a integrated circuit dielectrics. For example, the xerogels could be used as dielectrics in various locations within integrated circuits such as between polysilicon or polycide gates and wordlines and about microwave circuit elements.

The dimensions of the preferred embodiment structures could be varied, such as the minimal spacing between conductive lines being 0.18 or 0.13 $\mu$m or less, the metal line height could vary and the metal be copper or tungsten or alloys or suicides such as $TiSi_2$ or $CoSi_2$ or nitrides such as TiN or WN, and the oxide dielectric could be fluorinated oxide ($SiO_xF_y$) or an oxynitride or a multilayer stack of these, the passivation layer could be omitted or silicon nitride or oxynitride used, and so forth.

What is claimed is:

1. An integrated circuit dielectric, comprising:
   (a) a porous hybrid organic-silica material filling at least a portion of a space between first and second conductors.
2. The dielectric of claim 1, wherein:
   (a) said material includes C—Si—O—Si—C bonds.
3. The dielectric of claim 2, wherein:
   (a) said material is a polymer with O—Si—A—Si—O bonds where A is an organic group.
4. The dielectric of claim 3, wherein:
   (a) said group A has the characteristic of the shortest path of carbon atoms between the two bonds to Si has at most 12 carbon atoms.
5. The dielectric of claim 4, wherein:
   (a) said group A is a (fluorinated) aromatic ring, $C_6H_nF_{4-n}$, where n is an integer in the range $0 \leq n \leq 4$.
6. A method of integrated circuit dielectric formation, comprising:
   (a) coating a substrate with a solution of oligomers of hydrolyzed monomers of the general formula $(RO)_3$Si—A—Si$(OR)_3$ where R is an alkyl group and A is an organic group;
   (b) processing said oligomers to form a porous hybrid organic-silica dielectric.

* * * * *